United States Patent [19]
Schild et al.

[11] Patent Number: 5,569,330
[45] Date of Patent: Oct. 29, 1996

[54] METHOD AND DEVICE FOR CHEMICALLY TREATING SUBSTRATES

[75] Inventors: Robin Schild, Villingen-Schwenningen; Milan Kozak, Hüfingen; Johann Durst, Donaueschingen, all of Germany

[73] Assignee: Steag MicroTech GmbH Donaueschingen, Donaueschingen, Germany

[21] Appl. No.: 367,358

[22] PCT Filed: May 17, 1994

[86] PCT No.: PCT/EP94/01585

§ 371 Date: Jan. 13, 1995

§ 102(e) Date: Jan. 13, 1995

[87] PCT Pub. No.: WO95/28736

PCT Pub. Date: Oct. 26, 1995

[30] Foreign Application Priority Data

Apr. 15, 1994 [DE] Germany .................. 44 13 077.5

[51] Int. Cl.⁶ ............... B08B 3/10; B08B 3/12; B08B 11/02
[52] U.S. Cl. .................. 134/1; 134/26; 134/31; 134/32; 134/37; 134/902; 134/61; 134/105; 134/186; 34/77; 34/78
[58] Field of Search .............. 134/1, 26, 28, 134/31, 32, 36, 37, 902, 61, 105, 186; 414/938, 937; 34/78, 77

[56] References Cited

U.S. PATENT DOCUMENTS

| | | | |
|---|---|---|---|
| 4,611,966 | 9/1986 | Johnson | 414/404 |
| 4,722,752 | 2/1988 | Steck | 134/25.4 |
| 4,841,645 | 6/1989 | Bettcher et al. | 34/78 |
| 4,936,328 | 6/1990 | Yatabe | 134/66 |
| 5,226,242 | 7/1993 | Schwenkler | 34/78 |
| 5,275,184 | 1/1994 | Nishizawa et al. | 139/57 R |
| 5,369,891 | 12/1994 | Kamikawa | 34/78 |

FOREIGN PATENT DOCUMENTS

| | | |
|---|---|---|
| 0328746 | 8/1989 | European Pat. Off. |
| 0385536 | 9/1990 | European Pat. Off. |
| 4100126 | 7/1992 | Germany |
| 60-163435 | 8/1985 | Japan |
| 9212533 | 7/1992 | WIPO |
| 9403284 | 2/1994 | WIPO |

*Primary Examiner*—Jill Warden
*Assistant Examiner*—Saeed T. Chaudhry
*Attorney, Agent, or Firm*—Robert W. Becker & Associates

[57] ABSTRACT

A method for treating substrates includes chemically treating at least one substrate in a container with at least one treatment fluid and washing said at least one substrate with a washing fluid in the same container. Subsequently, the at least one substrate is dried.

27 Claims, 9 Drawing Sheets

METHOD AND DEVICE FOR CHEMICALLY TREATING SUBSTRATES

BACKGROUND OF THE INVENTION

The invention relates to a method for chemically treating substrates in which at least one substrate is subsequently subjected to a chemical treatment, a washing step, and a drying step, and a device for performing the aforementioned chemical treatment.

To date an automatic wet treatment device has a series of tubs or of reservoirs for a sequence of chemical wet processes. After completion of a certain chemical process sequence the substrate, for example, a silicon wafer, is immersed in a separate washing, respectively, rinsing tub and subsequently dried.

The drying of the substrate can, for example, be performed with a centrifuge, but can also be carried out during the slow removal of the substrate from the washing tub.

From European document 0 385 536 the so-called Marangoni dryer is known. In the method disclosed in this patent a vapor is applied to the substrate in addition to the slow removal of the substrate from the bath, whereby the vapor does not condense on the substrate, but diffuses into the liquid. At the liquid meniscus of the substrate surface a concentration gradient will result and thus a surface tension gradient. This gradient results in a liquid movement away from the substrate into the liquid (Marangoni effect) and leads to a residue-free drying of the substrate.

From U.S. Pat. No. 4,722,752 a device and a method are known for rinsing and drying wafers, whereby the wafer is enclosed in a cassette. The wafers are removed from the rinsing bath separate from the cassette and are subsequently inserted into the cassettes that have been slowly removed and dried also.

The described device, respectively, methods have the following disadvantages: The rinsing reservoir in each case is a separate bath from the other process reservoirs and serves only for rinsing the substrate. However, an individual and separate rinsing reservoir means an increased space requirement. Furthermore, the substrate must be moved through the surface of the fluid used for the chemical treatment into the air and subsequently must be inserted into the rinsing fluid which, and this may have disadvantageous effects with respect to the particle contamination of the substrate, as is well known in the art. This is especially true for hydrophobic surfaces, for example, after HF treatment. Furthermore, the insertion into, respectively, removal of the substrates from the various baths for chemical treatment, respectively, the rinsing step results in an increased time expenditure. Also, the known devices, respectively, methods always require a cassette (carrier) for handling the substrates.

It is therefore an object of the invention to provide a method for chemically wet treating, respectively, a device for such a method which economizes the process sequence of an automatic wet treatment device, i.e., saves time and space. A further object of the invention is to minimize the contamination of the substrate during such a sequence of chemical wet processes. Finally, a further object of the invention is to make obsolete the need for a cassette or similar holding device for the substrate in connection with the insertion of the substrate into respectively, the removal of the substrate from the reservoirs.

SUMMARY OF THE INVENTION

This object is inventively solved by performing the chemical treatment and the washing process in the same reservoir.

The inventive method is primarily characterized by the steps of:
  chemically treating at least one substrate in a container with at least one treatment fluid;
  washing the at least one substrate with a washing fluid in the same container; and
  drying the at least one substrate.

The method advantageously further comprises the step of replacing the at least one treatment fluid used in the chemical treatment step with the washing fluid. The step of replacing preferably includes the step of displacing the at least one treatment fluid with the washing fluid.

The washing step includes the step of introducing the washing fluid into the container and simultaneously draining the at least one treatment fluid. The washing fluid is expediently introduced at a location that is different from a location of draining the at least one treatment fluid. The location of introducing the washing fluid is at the bottom of the container.

Draining of the at least one treatment fluid is carried out by allowing the at least one treatment fluid to flow over the upper edges of the container.

Preferably, the step of chemically treating includes the step of sequentially treating the substrate with at least two of the treatment fluids.

Between individual treatments of the sequential treating step the substrate is preferably intermediately dried. The step of intermediately drying includes the step of removing the substrate from the treatment fluid. The step of intermediately drying may include the steps of slowly lifting the substrate from the container and applying a vapor that diffuses into the treatment fluid and does not condense on the substrate. The mixture of the vapor and the treatment fluid has a surface tension that is smaller than the surface tension of the treatment fluid.

The at least two treatment fluids are selected from the group consisting of a chemical treatment fluid and a rinsing fluid.

Preferably, a first chemical treatment fluid, a rinsing fluid, and a second chemical treatment fluid are sequentially used.

It is expedient to use a first and a second chemical treatment fluid sequentially.

The step of sequentially treating the substrate includes the step of replacing at least partially the previous treatment fluid with the subsequent treatment fluid. The step of replacing the previous treatment fluid is at least partially displaced by the subsequent treatment fluid.

The chemical treatment step includes the step of introducing the subsequent treatment fluid into the container and simultaneously draining the previous treatment fluid from the container.

The treatment fluids are introduced at a location that is different from a location of draining the treatment fluids. The location of introducing the treatment fluids is preferably at the bottom of the container.

Draining of the treatment fluids is preferably carried out by allowing the treatment fluids to flow over the upper edges of the container.

The method advantageously further comprises the step of removing the substrate from the washing fluid, wherein the step of drying is performed during the step of removing. The step of drying includes the steps of slowly lifting the substrate from the container and applying a vapor that diffuses into the washing fluid and does not condense on the substrate. The mixture of the vapor and the washing fluid has a surface tension that is smaller than the surface tension of the washing fluid.

The treatment fluid can be hydrofluoric acid or ozone.

The step of washing includes the step of applying mega sound.

The invention also relates to a method of inserting into and removing from a container at least on substrate and includes the steps of:

securing the at least on substrate on a receiving device;

lowering the at least one substrate into the container with the receiving device and lifting the at least one substrate from the container with the receiving device.

Preferably, this method further comprises the steps of providing a blade at the receiving device and providing supports at the receiving device. In the step of lifting the at least one substrate is raised to a point where guides at a hood secure the at least one substrate.

Advantageously, the method further comprises the steps of providing moveable holders and, after lifting of the at least one substrate, positioning the moveable holders underneath the at least one substrate for securing the at least one substrate in its position.

The invention also relates to a device for chemically treating at least one substrate in a container with at least one treatment fluid, washing the at least one substrate with a washing fluid in the same container, and drying the at least one substrate. The inventive device comprises:

a first container;

a device for introducing a fluid into the container;

a device for removing the fluid from the container; and a receiving device for receiving at least one substrate.

The device for removing has an overflow.

The device preferably further comprises a second container surrounding the first container.

Advantageously, leveling screws are provided for leveling the container.

The device for introducing advantageously comprises a diffusor.

The device for introducing comprises a pump with an inlet mechanism.

Preferably, a vaporization device positioned above the first container is provided.

The device further comprises a hood positioned above the first container and the vaporization plant. The hood has a guide for the at least one substrate. The guide has two parts for holding the at least one substrate laterally. At least one of the two parts has a slanted edge.

The receiving device expediently comprises a blade and supports.

Above the container moveable holders for the at least one substrate are provided which, after lifting of the at least one substrate, are moveable into a position under the at least one substrate.

The device may further comprise a means for emitting mega sound.

Advantageously, the chemical treatment and the washing process are performed within the same container by adding to, respectively, by (partially) replacing the fluid for the chemical treatment with a further such fluid and/or replacing with a washing fluid. Preferably, in a sequential chemical process a rinsing fluid is first introduced before replacing the fluid for the chemical treatment with a further such fluid and the substrate, respectively, the substrates are removed from the container and simultaneously dried. Subsequently, the rinsing fluid is replaced by a further fluid for chemical treatment and the substrate is again introduced into the container.

In a preferred embodiment of the invention the drying process takes place during the removal of the substrate from the rinsing or washing fluid. This encompasses usually a very slow removal of the substrate from the rinsing or washing fluid.

In order to make this process more efficient, it is advantageous to use a vapor on the substrate which does not condense on the substrate but mixes with the washing fluid. Preferably, the mixture has a smaller surface tension than the rinsing or washing fluid which means that a force is provided that forces the washing fluid adhering to the substrate back into the container.

The replacement of the fluid for chemical treatment with the washing fluid in a preferred embodiment is carried out by displacement. A drainage of, for example, the fluid for chemical treatment and a subsequent introduction of the rinsing or washing fluid would result in subjecting the substrate to an increased particle contamination in the air. The displacement of one fluid with another, for example, with the washing fluid, has the advantage that the substrate does not have to pass through a phase border and is not exposed to air. Of course, it is possible that a plurality of fluids for chemical treatment can be replaced by displacement before the washing step. Especially in connection with the replacement of a fluid for chemical treatment with a further such treatment fluid, the replacement can be a partial replacement, i.e., a mixing.

Preferably, the washing fluid is introduced into the container and simultaneously the mixture of the fluid for chemical treatment and the fluid is drained.

The introduction of the rinsing or washing fluid and the drainage of the fluid for chemical treatment takes place preferably at different locations of the container. For example, this results in an optimization of the replacement of one fluid with another fluid in a timely fashion.

The introduction of the washing fluid preferably takes place at the bottom of the container while the drainage of the mixture is carried out by overflow. The drainage thus does not require an additional pumping device. With the introduction at the bottom of the container, i.e., far removed from the location of drainage, the smallest possible amount of introduced washing fluid is drained off. Also, with respect to gravity, this arrangement can be additionally advantageous, for example with an additional temperature gradient. This is advantageous with respect to economical considerations and is also time-saving.

In a preferred embodiment of the invention the fluid for chemical treatment is diluted hydrofluoric acid. A treatment in diluted hydrofluoric acid (HF) serves to remove the oxide layer on a substrate surface and to provide a hydrophobic, hydrogen-passivated surface that is required for some subsequent processes.

In a further preferred embodiment of the invention the fluid for chemical treatment is ozone. A treatment with ozone is performed when it is desired to again grow a chemical oxide on the substrate surface, for example, after treatment with HF for cleaning purposes, and to thus provide a hydrophilic surface.

The object of the invention is furthermore solved inventively such that in a method for introducing and/or removing at least one substrate into, respectively, from the container, the substrate is secured within the container by a receiving device and is inserted and removed with the receiving device.

An advantage of the invention is that a cassette as a holder for the substrate for insertion and removal of the substrate is no longer needed. The inventive method thus does not need a carrier. Accordingly, the known disadvantages of a carrier in connection with the drying step (no drying takes place at the contact locations of the carrier in the substrate) are avoided. The inventive receiving device is not a carrier but simply a support movable back and forth for one or more substrates. A carrier-free drying not only eliminates the step of drying the carrier, but also reduces with respect to the rinsing or washing process the required time as well as the consumption of rinsing or washing fluid. Also, the entrainment of chemicals into the dryer is reduced with the carrier-free process.

Advantageously, the receiving device is comprised of a two-part support device and a separate, vertically movable blade.

Preferably, the receiving device removes the substrate from the container to such a location that it can be guided, respectively, held by guides that are arranged on opposite inner sides of a hood.

In a preferred embodiment movable holders are provided that secure the substrate after removal from the container in their position above the container in a dry state. The movable holders below, respectively, within the hood are designed such that, when the substrate is secured by the movable holders, the hood can be opened, respectively, closed without problems and without changing the position of the substrate. The movable holders are always dry and have contact only with the already dried substrates.

Advantageously, the inventive method provides for an enhancement of the washing, respectively, cleaning step by ultrasound, respectively, megasound. Advantageously, for this purpose the container is provided with piezoelements in order to generate sound waves for cleaning the substrate. Such a "mega-sonic" system is advantageous in this context because the particle contamination of the substrate is reduced to a minimum with the inventive method. Thus, an extremely thorough cleaning of the substrate is achieved.

The object of the invention is also inventively solved by a device for chemically treating that comprises:

an introduction device for a fluid into the container;

a drainage device for fluid from the container;

a receiving device for the substrate.

Preferably, in addition to the (inner) container at its outer sides an outer container is provided that serves, for example, as a safety reservoir.

For leveling the container with respect to a uniform overflow of the fluid to be replaced, leveling screws are advangtaeously provided.

Advantageously, the introduction device is a diffusor, preferably at the bottom of the container. This is, for example, expedient for the aforementioned ozone ($O_3$).

In the case of a liquid, for example, diluted hydrochloric acid, a pump in combination with an inlet mechanism, preferably also at the bottom of the container, is advantageous.

In a preferred embodiment a hood is provided above the container in order to protect the container, respectively, also the dried substrate from particle contamination and in order to provide a tight vapor atmosphere in the area above the container. For introducing the vapor, the hood is provided with an integrated diffusor, i.e., a perforated diffusor plate integrated into the hood for the introduction, respectively, distribution of an IPA (Isopropyl alcohol)/$N_2$ mixture. In this manner, a homogenous and identical vapor atmosphere for all substrates is produced within the process chamber so that the process conditions for each wafer are identical. The mixing of IPA with nitrogen takes place in a bubbler.

Preferably, the substrate is secured within the container with the receiving device that is comprised of a blade-shaped part, the so called blade, and, for example, two supports. The blade and the supports are movable relative to one another and the blade is advantageously positioned between the two supports. The supports are located within the container, while the blade can also be removed from the fluid.

In a preferred embodiment of the invention the hood is provided with guide means above the container. The guide means is advantageously connected to the inner side of the hood at two oppositely arranged sides. The substrate, for example, a silicon wafer, can be guided, respectively, secured in this guide means.

The guide means is connected to opposite sides of the hood. It is groove-shaped for receiving a plurality of substrates. Thus, the use of a cassette for securing the substrate is obsolete.

Preferably, the guide within the hood is of a two-part construction whereby at least one edge of the receiving means is slanted in order to facilitate receiving of the substrate.

Advantageously, at least one part of the guide has a slanted edge for easy reception of the substrate. This also simplifies opening and closing of the hood.

In a preferred embodiment of the invention, movable holders are provided which can be introduced from the exterior below the hood and above the container into a position above the container. They have an arc-shaped depression. The movable holders as well as the receiving device in the hood and the assembly of blade and the two supports can by themselves hold the substrate within the container. When the substrate is resting on the arc-shaped depression of the movable holders and when it is secured by the guide means within the hood, the hood can be opened without entraining the substrate. The substrate is then held only by the movable holders until the operator removes them for further treatment.

BRIEF DESCRIPTION OF THE DRAWINGS

The invention as well as further developments and advantages of it will be explained in detail with the aid of several embodiments and the aid of several figures. The drawings show in.

DESCRIPTION OF PREFERRED EMBODIMENTS

Figure 1:
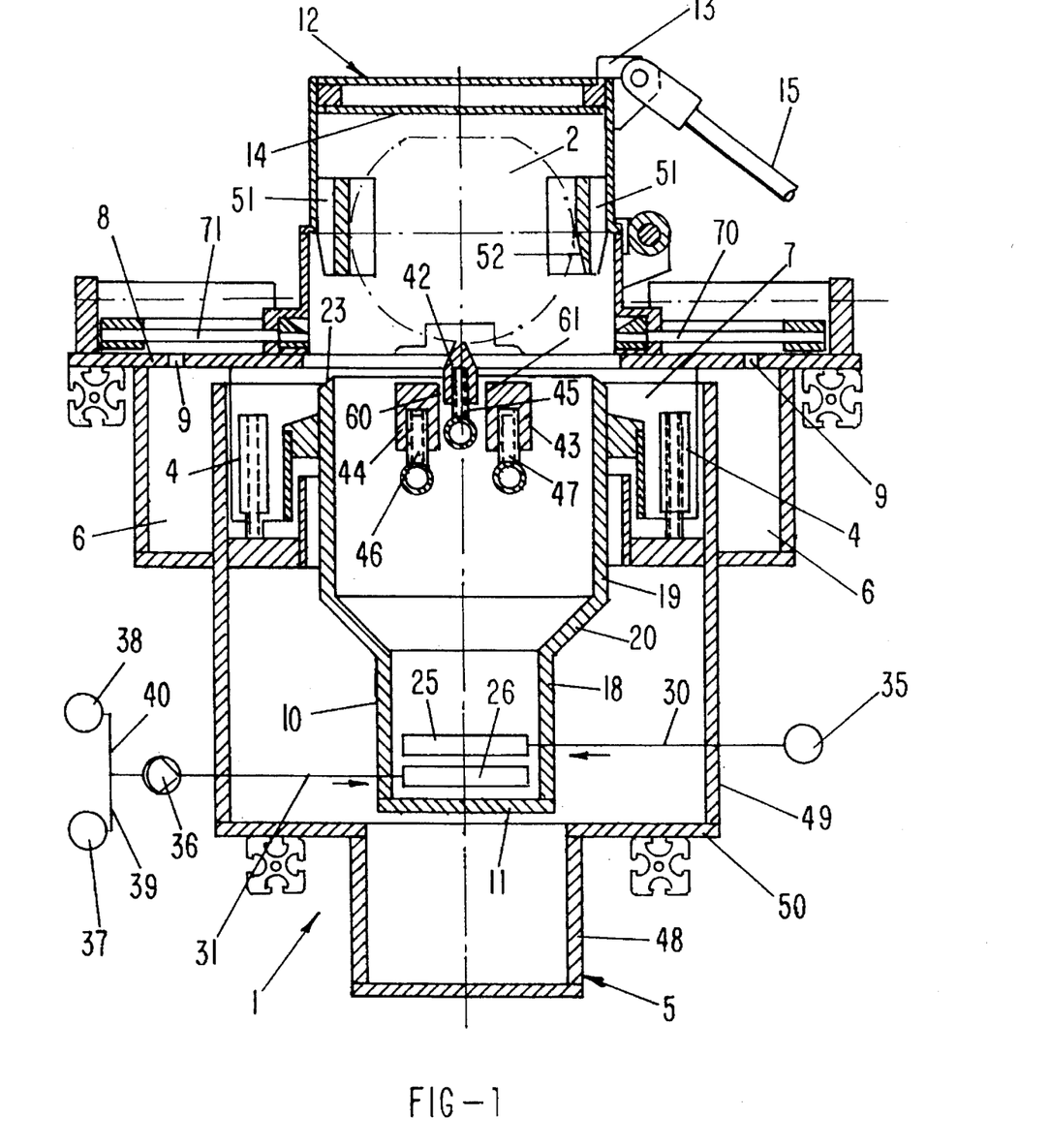
FIG. 1 a cross-sectional view of the inventive device.

FIG. 1 shows a device for chemical wet treatment 1 of substrates, especially of a wafer 2. The device 1 is comprised of an outer container 5 and an inner container 10. The outer container 10 has an outer annular chamber 6 and an inner annular chamber 7. Above the inner container 10 a hood 12 with an opening mechanisms 13 is provided for covering the inner container 10. The hood 12 has a chamber delimited by a diffusor plate 14 into which can be introduced, for example, an IPA/N$_2$ mixture. The inner container 10 comprises a narrow cylinder 18 located at the lower end of the inner container 10. A frusto-conical intermediate section 20 widens the diameter of the inner container 10 to a wider cylinder 19. The edge at the upper end of the inner container 10 is in the form of a slanted outer edge 23. This improves the properties of the upper edge of the inner container 10 with respect to overflow of the fluid. With leveling screws 4, that connect the inner container 10 to the outer container 5 and that are arranged within the chamber 6 of the outer container, the inner container 10 can be leveled in order to guarantee a uniform overflow of the fluid over the entire length of the container. The inner container 10 at its bottom 11 is provided with two inlet devices, a diffuser 25 and an inlet mechanism 26, arranged atop one another. The diffusor 25 is arranged above the inlet mechanism 26. The diffusor 25 is connected with a line 30 to a fluid container 35 that preferably contains ozone (O$_3$). In the drawings the flow direction of the ozone is indicated by an arrow. The inlet mechanism 26 is connected with a line 31 to a pump 36. The pump 36 pumps facultatively from the fluid reservoir 37, respectively, 38 via the lines 39, respectively, 40 a fluid for chemical treatment for the wafers 2, for example, diluted hydrofluoric acid. In FIG. 1, the arrow represents the direction of fluid of the pumped fluid within the line 31. Within the inner container 10 right and left support devices 43, 44 are also provided which are attached to two securing devices 46, 47 that are displaceable parallel in the vertical direction within the inner container 10. The right and left supports 43, 44 are provided with an arc-shaped cutout 60, 61 for receiving the wafer 2. In the center between the two supports 43, 44 a so-called blade 42 is provided, i.e., an elongate element with a pointed edge. The blade 42 is, for example, made of quartz glass and is movable independent of the right and left supports 43, 44 in the vertical direction. In FIG. 1 it can be seen that the blade 42 has lifted the wafer 2 from the inner container 10 and the wafer 2 is secured by a holder 51 above the inner container 10 within the hood 12. The guide means or wafer receiving device 51, in analogy to the supports 43, 44, has a groove shape in order to simultaneously hold a plurality of wafers without a cassette. To facilitate insertion of the wafer 2 into the guide means 51, one inner edge 52 of the guide means 51 is slanted. The wafer or wafers 2 are secured or guided by the guide means 51. The outer container 5 is closed off in the upward direction by a cover 8 that has an opening 9. The outer container 5, which serves as a safety reservoir, is comprised of a narrow cylinder 48 which is connected with an intermediate section 50, in the form of a disk with a central circular opening, to the wider cylinder 49. The wider cylinder 49 forms the outer shell of the inner annular chamber 7, respectively, the inner shell of the outer annular chamber 6 from which the overflowing fluid can be drained, respectively, pumped through the opening 9.

Figure 2:
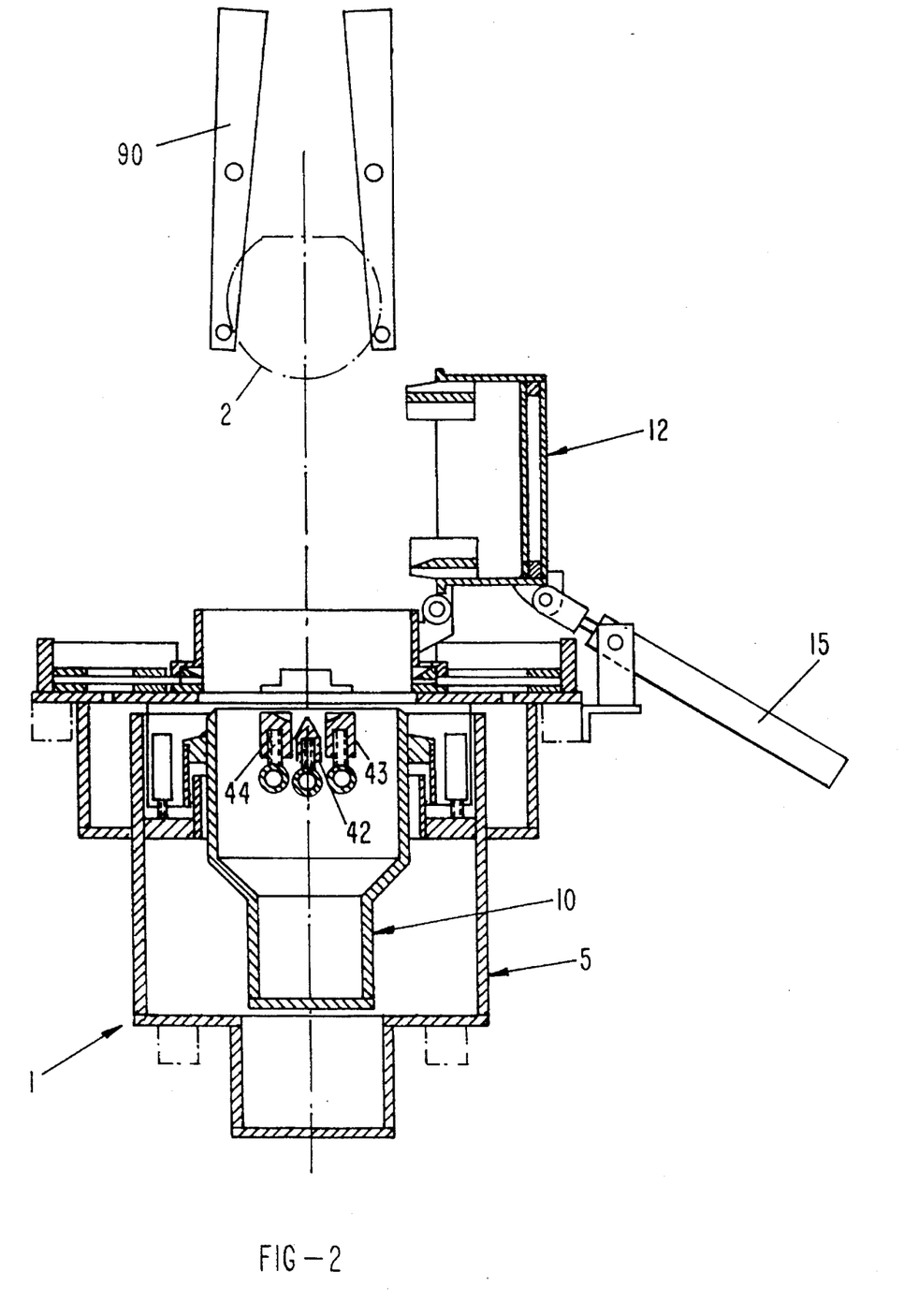
FIG. 2 a first step of the inventive process sequence.

FIG. 2 shows the first step of the process sequence represented in FIGS. 2 to 9. In FIG. 2 it is shown that a wafer packet, represented by one wafer 2, is fed to the device with a gripping device 90. The hood 12 that is connected to the guide means 51, has been opened by the automatic cylinder 15. The blade 42 and the right and left supports 43, 44 are ready to receive the wafer 2. For this purpose, the blade 42 is slightly lowered relative to the supports 43, 44 so that the tip of the blade 42 is positioned on a circular line defined by the arc-shaped cutouts 60, 61 on which later on the wafer 2 will rest.

Figure 3:
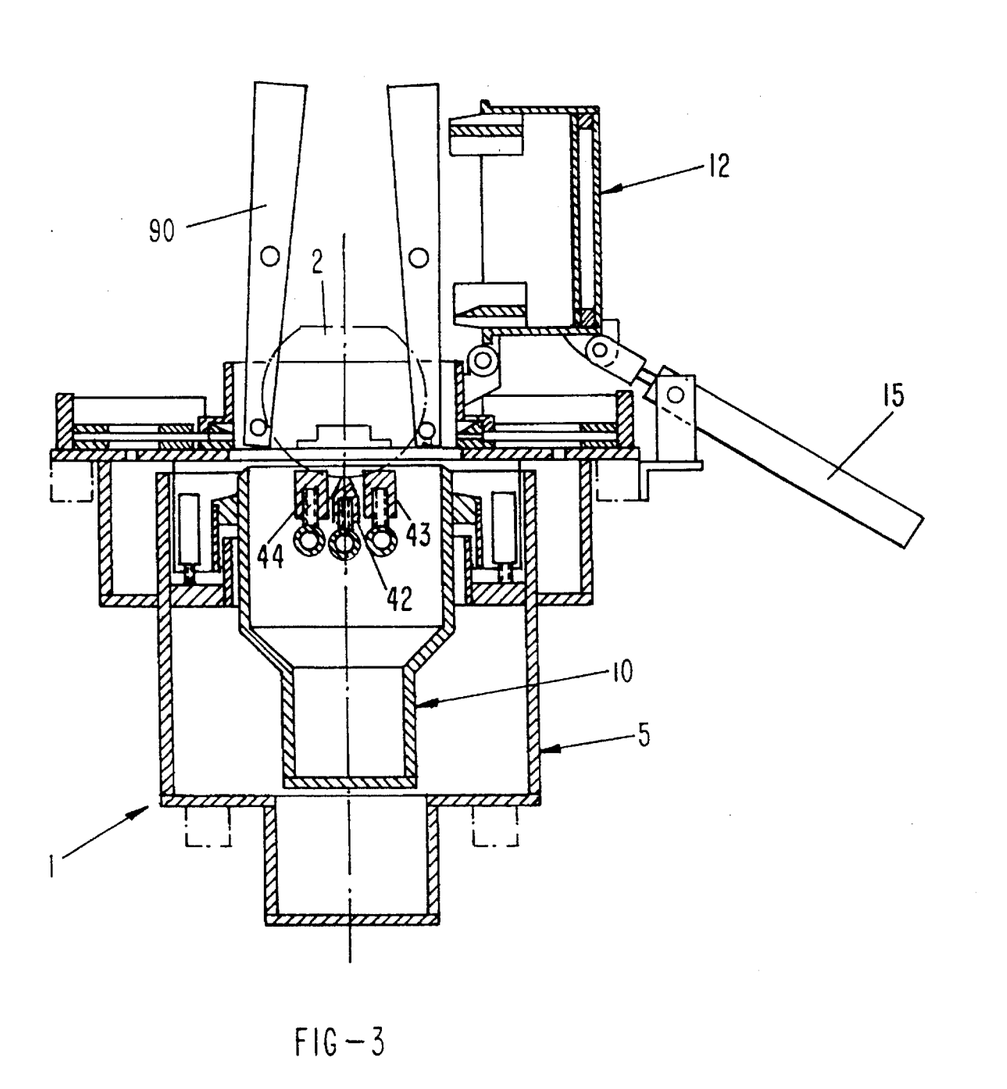
FIG. 3 a second step of the inventive process sequence.

FIG. 3 illustrates the lowering of the wafer 2 into the inner container 10, which is, for example, filled with HF.

Figure 4:
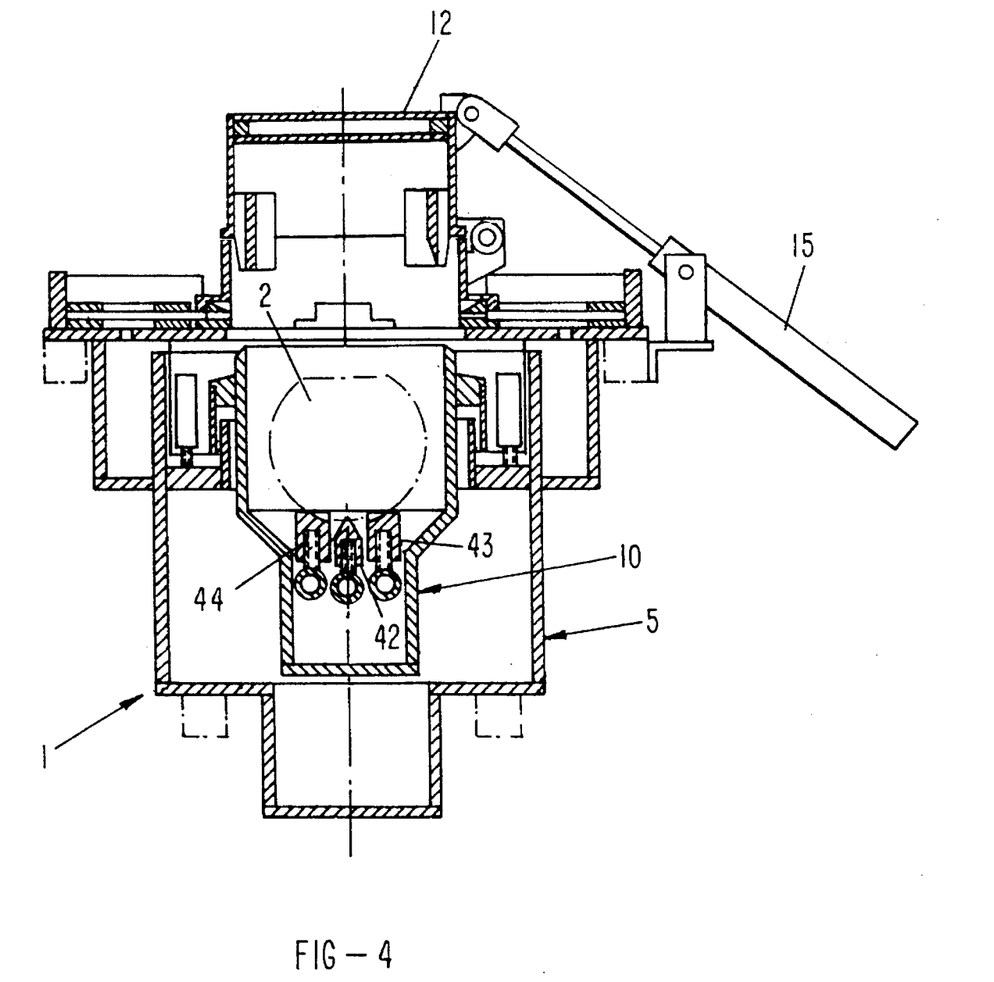
FIG. 4 a third step of the inventive process sequence.

FIG. 4 shows that the hood 12 above the container 10 is closed and the wafer 2 is being lowered into the inner container 10 into a low position approximately at the level of the intermediate section 20, whereby the blade 42 and the right and left supports 43, 44 are moved downward at the same speed.

Figure 5:
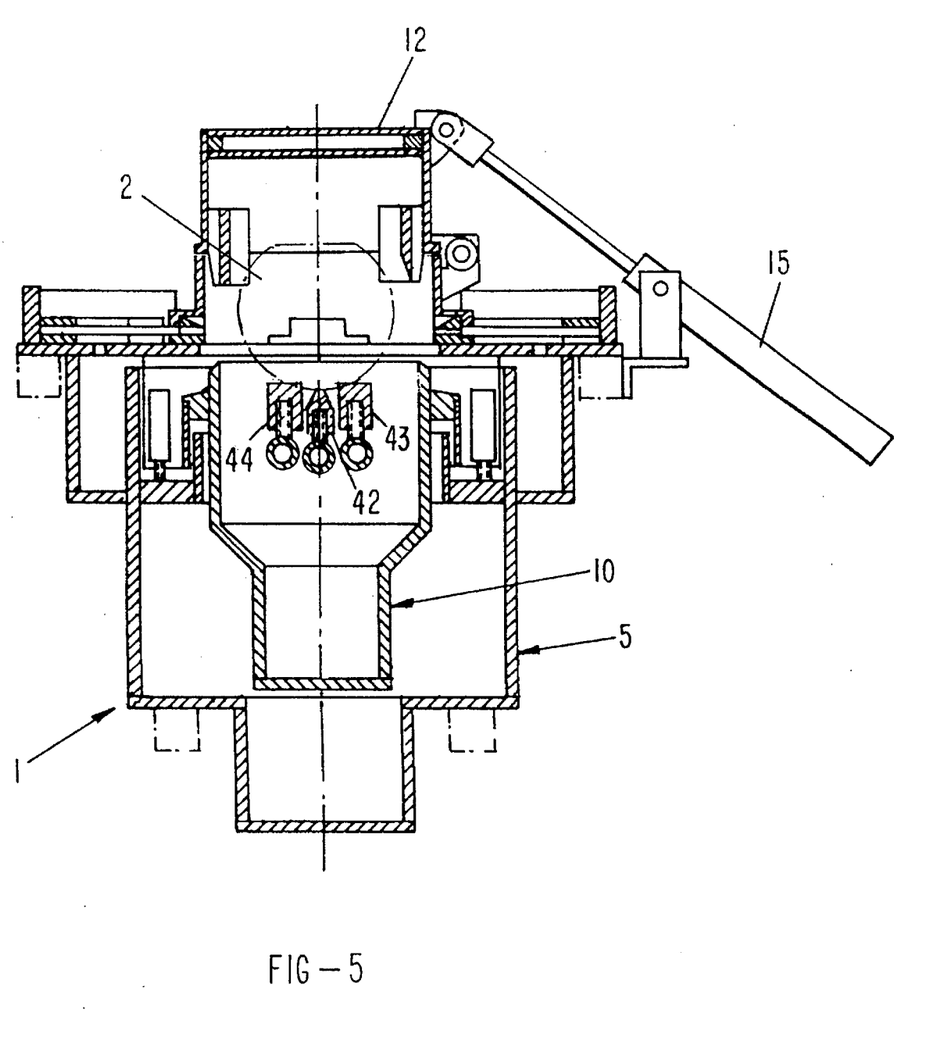
FIG. 5 a fourth step of the inventive process sequence.

In FIG. 5 the drying step of the wafer 2 is represented, i.e., the removal of the wafer 2 from the inner container 10. Inventively, between the steps represented in FIGS. 4 and 5 the chemical treatment fluid HF is replaced by another fluid, whereby as a last step preferably a washing fluid is introduced. Preferably, above the inner container 10 the wafer is exposed to a vapor which does not condense on the wafer 2; however, the mixture of washing fluid and vapor has a reduced surface tension relative to the washing fluid alone. For this step, the hood 12 is still in the closed position. Advantageously, the blade 42 is moved at a constant speed upwardly, whereby the two supports 43, 44 are moved at half the speed, so that they stay behind.

Figure 6:
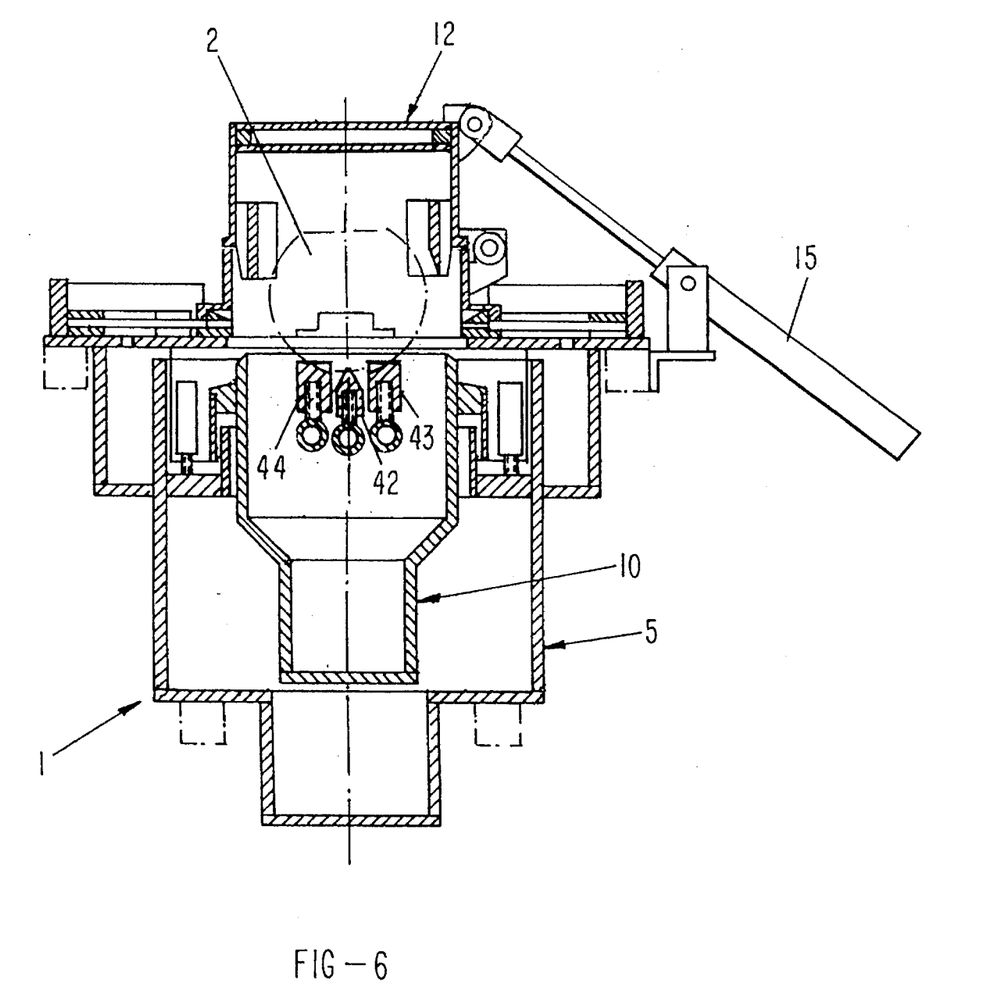
FIG. 6 a fifth step of the inventive process sequence.

In FIG. 6 the supports 43 and 44 are stopped, a further lifting of the wafer 2 takes place only with the blade 42. It is shown that the wafer 2, before removal only by the blade 42, is still in contact with the washing fluid within the container 10.

Figure 7:
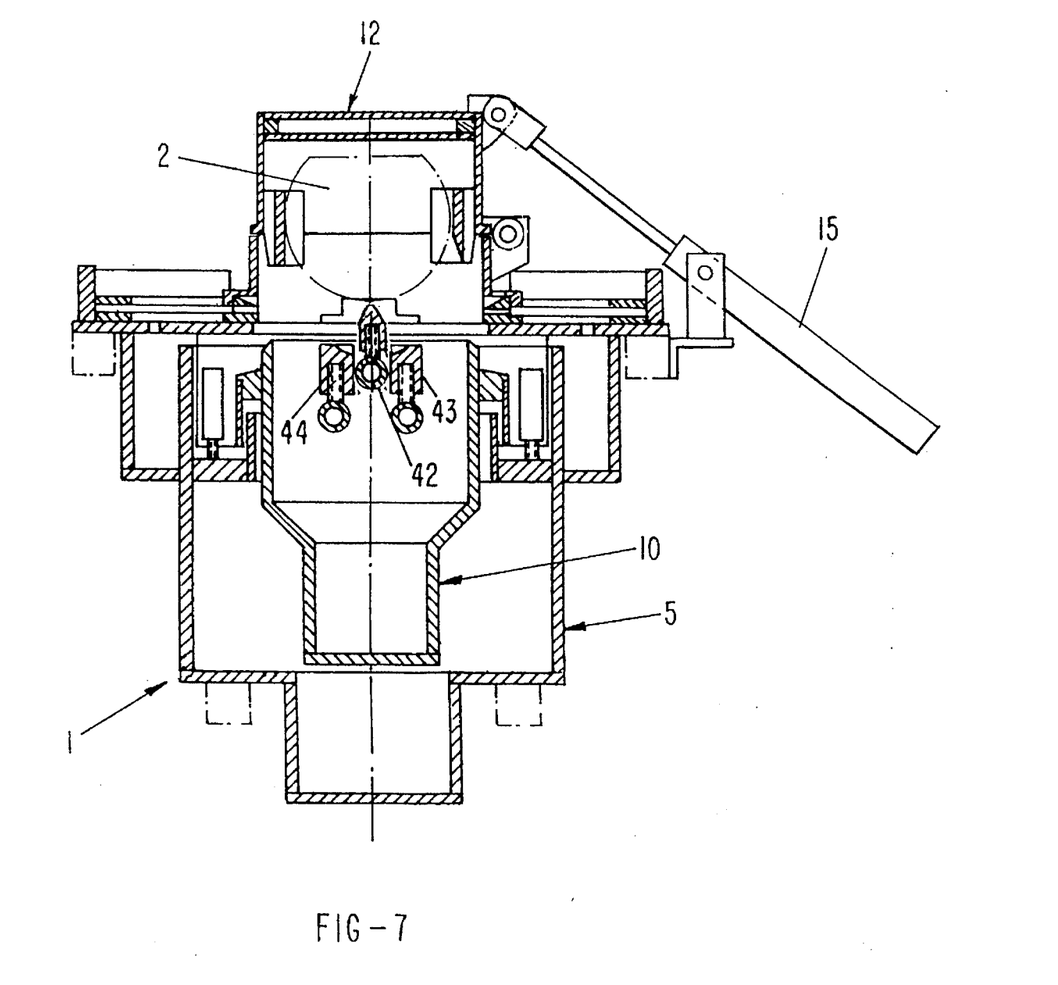
FIG. 7 a sixth step of the inventive process sequence.

In FIG. 7 the end of the drying process is represented, i.e., the wafer is completely removed from the inner container 10 and is secured by the blade 42 and the guide means 51.

Figure 8:
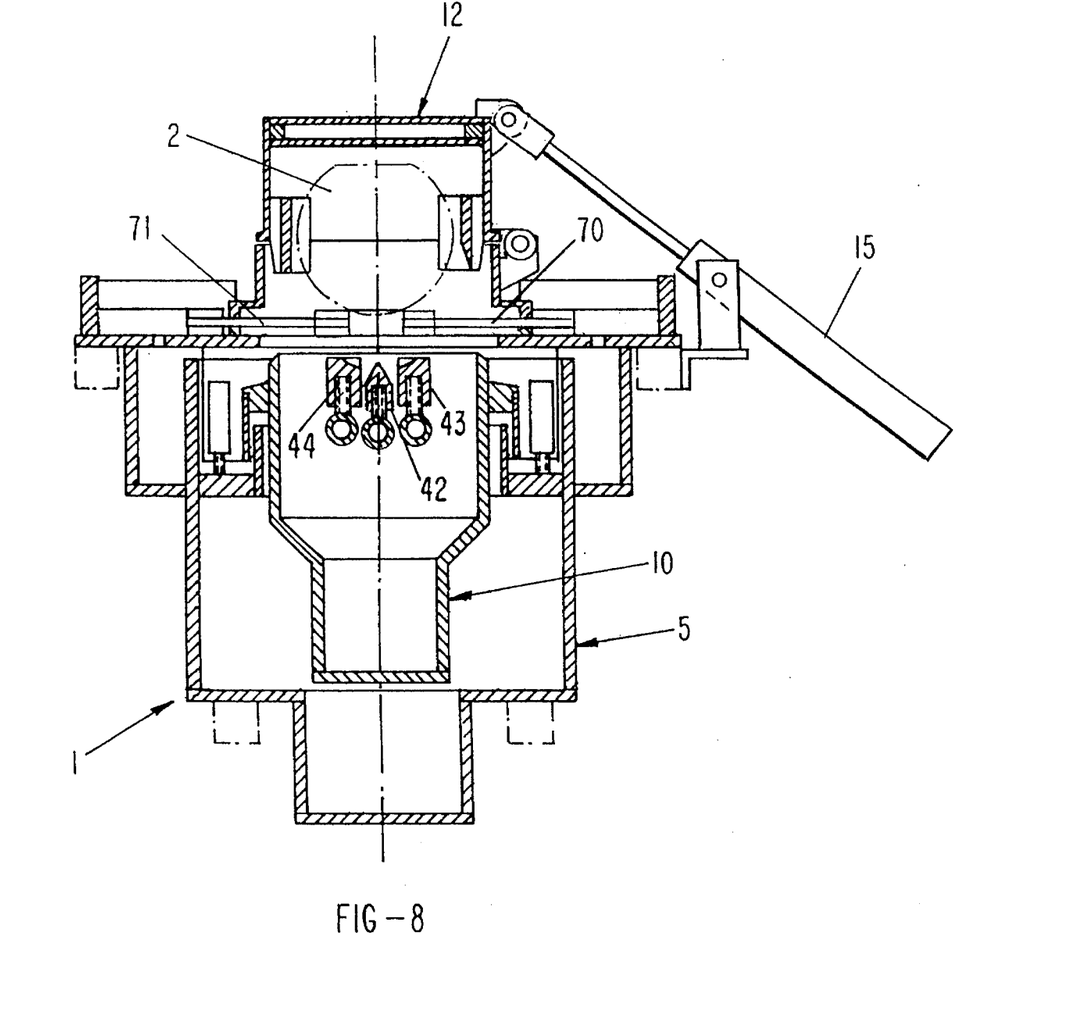
FIG. 8 a seventh step of the inventive process sequence.

FIG. 8 illustrates that before opening the hood 12 the movable holders 70, 71 are introduced into the space above the inner container 10 in order to secure the wafer 2 from below in their position during, respectively, after opening of the hood 12, i.e., the removal of the guide means 51. The wafers 2 can be secured only by the movable holdes 70, 71, i.e., the blade 42, the supports 42, 43, and the wafer guide means 51 are no longer needed for further securing the wafer 2. The movable holder 70, 71 have arc-shaped cutouts in order to secure the wafer 2 in their position. It is also shown in FIG. 8 that the blade 42 is again submerged within the inner container 10 in its initial position (compare FIG. 2) below the right and left supports 43 and 44.

Figure 9:
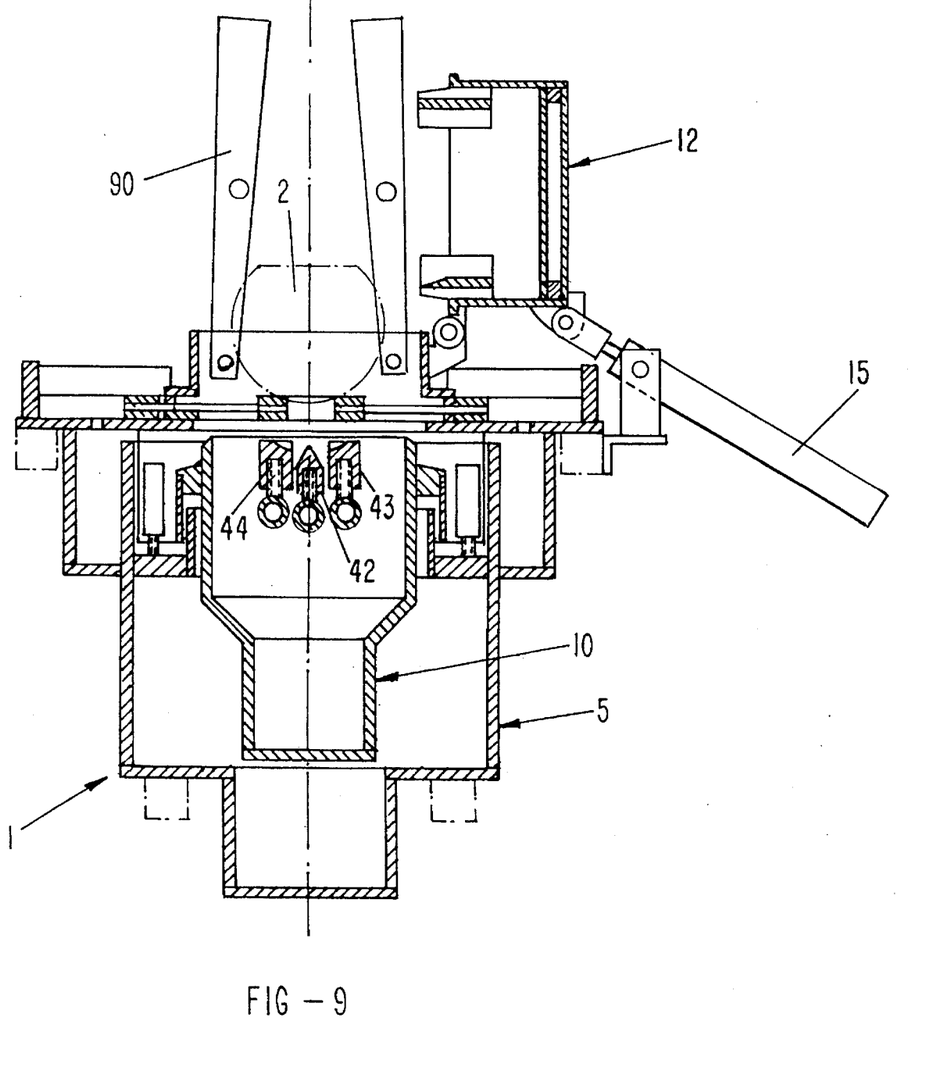
FIG. 9 an eighth step of the inventive process sequence.

In FIG. 9 the hood 12 is opened and the gripping device 90 removes the wafer 2 from the device 1 for further processing. FIGS. 2 to 9 thus show a cyclical process.

The invention has been explained with the aid of preferred embodiments. However, to a person skilled in the art numerous deviations, respectively, other embodiments are obvious without leaving the gist of the present invention.

The present invention is, of course, in no way restricted to the specific disclosure of the specification and drawings, but also encompasses any modifications within the scope of the appended claims.

We claim:

1. A method for treating substrates, said method comprising the steps of:

positioning at least one substrate above a container;

positioning a hood with a guide above the container; surrounding said at least one substrate; lowering said at lest one substrate into the container;

chemically treating the at least one substrate in the container with at least one treatment fluid;

washing said at least one substrate with a washing fluid in the same container;

lifting said at least one substrate from the container into the hood and guiding said at least one substrate in to the guide of the hood; and drying said at least one substrate in the hood.

2. A method according to claim 1, further comprising the step of replacing the at least one treatment fluid, used in the step of chemically treating, with the washing fluid.

3. A method according to claim 2, wherein the step of replacing includes the step of displacing the at least one treatment fluid with the washing fluid.

4. A method according to claim 3, wherein the washing step includes the step of introducing the washing fluid into the container and simultaneously draining the at least one treatment fluid.

5. A method according to claim 4, wherein the washing fluid is introduced at a location that is different from a location of draining the at least one treatment fluid.

6. A method according to claim 5, wherein the location of introducing the washing fluid is at a bottom of the container.

7. A method according to claim 5, wherein draining of the at least one treatment fluid is carried out by allowing the at least one treatment fluid to flow over upper edges of the container.

8. A method according to claim 1, wherein the step of chemically treating includes the step of sequentially treating the substrate with at least two of said at least one treatment fluid.

9. A method according to claim 8, wherein between individual treatments of the sequential treating step the substrate is intermediately dried.

10. A method according to claim 9, wherein intermediately drying includes the step of removing the substrate from the treatment fluid.

11. A method according to claim 9, wherein the step of intermediately drying includes the steps of slowly lifting the substrate from the container and applying a vapor that diffuses into the treatment fluid and does not condense on the substrate.

12. A method according to claim 11, wherein a mixture of the vapor and the treatment fluid has a surface tension that is smaller than the surface tension of the treatment fluid.

13. A method according to claim 8, wherein said at least two treatment fluids are selected from the group consisting of a chemical treatment fluid and a rinsing fluid.

14. A method according to claim 13, wherein a first chemical treatment fluid, a rinsing fluid, and a second chemical treatment fluid are sequentially used.

15. A method according to claim 13, wherein a first and a second chemical treatment fluid are used sequentially.

16. A method according to claim 13, wherein the step of sequentially treating the substrate includes the step of replacing at least partially a previous treatment fluid with a subsequent treatment fluid.

17. A method according to claim 16, wherein in the step of replacing the previous treatment fluid is at least partially displaced by the subsequent treatment fluid.

18. A method according to claim 13, wherein the chemical treatment step includes the step of introducing a subsequent treatment fluid into the container and simultaneously draining a previous treatment fluid from the container.

19. A method according to claim 18, wherein the treatment fluids are introduced at a location that is different from a location of draining the treatment fluids.

20. A method according to claim 19, wherein the location of introducing the treatment fluids is at a bottom of the container.

21. A method according to claim 19, wherein draining of the treatment fluids is carried out by allowing the treatment fluids to flow over an upper edges of the container.

22. A method according to claim 1, further comprising a step of removing the substrate from the washing fluid, wherein the step of drying is performed during the step of removing.

23. A method according to claim 1, wherein the step of drying includes the steps of slowly lifting the substrate from the container and applying a vapor that diffuses into the washing fluid and does not condense on the substrate.

24. A method according to claim 23, wherein a mixture of the vapor and the washing fluid has a surface tension that is smaller than the surface tension of the washing fluid.

25. A method according to claim 1, wherein the treatment fluid is hydrofluoric acid.

26. A method according to claim 1, wherein the treatment fluid is ozone.

27. A method according to claim 1, wherein the step of washing includes the step of applying mega sound.

* * * * *